(12) United States Patent
Hensel et al.

(10) Patent No.: US 10,775,826 B2
(45) Date of Patent: Sep. 15, 2020

(54) BACK-GATE BIASING VOLTAGE DIVIDER TOPOLOGY CIRCUIT STRUCTURE

(71) Applicant: GLOBALFOUNDRIES INC., Grand Cayman (KY)

(72) Inventors: Ulrich G. Hensel, Grundmühlenweg (DE); Jurgen Faul, Radebeul (DE); Arif A. Siddiqi, Milpitas, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/196,183

(22) Filed: Nov. 20, 2018

(65) Prior Publication Data
US 2020/0159270 A1 May 21, 2020

(51) Int. Cl.
*G05F 3/16* (2006.01)
(52) U.S. Cl.
CPC .................................... *G05F 3/16* (2013.01)
(58) Field of Classification Search
CPC .. G05F 1/44; G05F 3/16; H02M 3/06; H02M 3/08
See application file for complete search history.

(56) References Cited

U.S. PATENT DOCUMENTS

| | | | |
|---|---|---|---|
| 5,030,848 A | | 7/1991 | Wyatt |
| 5,923,212 A | * | 7/1999 | Womack ................. G05F 3/242 327/541 |
| 6,479,974 B2 | | 11/2002 | Cohn et al. |
| 8,384,469 B2 | | 2/2013 | Hashimoto et al. |
| 8,816,754 B1 | | 8/2014 | Clark et al. |
| 2018/0302038 A1 | * | 10/2018 | Balasubramaniyan ................. H03F 3/45179 |
| 2019/0238044 A1 | * | 8/2019 | McKay .................... H02M 1/00 |

OTHER PUBLICATIONS

A. Siddiqi, N. Jain and M. Rashed, "Back-bias generator for post-fabrication threshold voltage tuning applications in 22nm FD-SOI process," 2018 19th International Symposium on Quality Electronic Design (ISQED), Santa Clara, CA, 2018, pp. 268-273. (Year: 2018).*
S. Nedelcu et al., "Dynamic body bias for 22nm FD-SOI CMOS Technology," ITG-Fachbericht 266: Analog 2016, Sep. 14, 2016 in Bremen, 5 pages.

* cited by examiner

*Primary Examiner* — Kyle J Moody
*Assistant Examiner* — Jye-June Lee
(74) *Attorney, Agent, or Firm* — David Cain; Hoffman Warnick LLC

(57) ABSTRACT

Embodiments of the present disclosure provide a circuit structure including: a first tap node, a first operational element coupled to the first tap node, the first operational element including at least one transistor having a back-gate, a second tap node coupled to the first operational unit, a second operational element coupled to the second tap node, the second operational element including at least one transistor having a back-gate, and a first back-gate biasing voltage regulator coupled to the second operational element and the first tap node. The first back-gate biasing voltage regulator is configured to supply the at least one transistor of the second operational element with a back-gate biasing voltage level that is different than a voltage level available to the second operational element from the second tap node.

18 Claims, 4 Drawing Sheets

BACK-GATE BIASING VOLTAGE DIVIDER TOPOLOGY CIRCUIT STRUCTURE

TECHNICAL FIELD

Embodiments of the disclosure relate generally to voltage divider circuit board topologies and circuit structures for producing body-biasing voltages for circuits including transistors having body or back-gate terminals.

BACKGROUND

Circuit topology is critical to the study and use of electrical hardware. Circuit topology describes how circuit structures may be coupled together to ideally perform various electrical or logical functions within a circuit board or integrated chip. While many circuit topologies exist, one useful topology can be described as a voltage division topology. Voltage division topologies generally have one large voltage supply coupled to a plurality of descending interconnected operational elements, where the output voltage of one operational element is the input voltage of the next interconnected operational element. As a result of each operational element's resistance and performance of the designed function, a voltage division occurs and results in a decreased output voltage to power the next operational element. The operating voltage for a single operational element is the difference between the input voltage and the output voltage. The topology of the system voltage divider determines the absolute input and output voltage levels. The operating voltage of operational elements of the same circuit design in such a topology shall be the same within certain voltage variation limits. In such a system, each operational element is coupled to a system controller to ensure that voltage division across the circuit topology is working properly. The system controller manages the performance of each of the operational elements, therefore balancing current consumption per operational element and desired voltage division in the whole system. Due to the voltage division, each successive operational element will have a lower input and output voltage, while the operating voltage of operational elements of the same design should stay the same within in voltage variation limits.

Fully-depleted semiconductor-on-insulator (FD-SOI) PFET and NFET transistors include back gate terminals that can be used to influence the effective threshold voltage of the transistors by applying positive and negative voltages. Usually the positive voltages are larger than the operating voltage of these circuits. In one instance, positive voltages applied to the back-gate of NFETs and negative voltages applied to the back-gate of PFETs reduce the effective threshold voltage of both, which leads to a speed up of both devices.

The application of voltages to a back-gate in order to change the effective threshold voltage is called back-gate or body biasing (BB). Back-gate biasing is a design method that improves power, performance and area metrics of a circuit. However, back-gate biasing requires 1) a source for the positive voltages larger than the operating voltage, 2) a source for negative voltages, and 3) a voltage regulator to fine tune the positive and negative voltages such that the optimal effective threshold voltages for the circuits can be applied. In the prior art, positive and negative on-circuit charge pumps have been used as a source for 1) and 2), respectively, together with an on chip voltage regulator to serve 3). These charge pumps consume area and power on each circuit, reducing the power performance and area benefit provided by back-gate biasing. The power and area penalty of the charge pumps increases by the difference of the back-gate voltages compared to the available input operating voltage to the charge pump, such that for circuits with very low operating voltage (for instance 0.4V), the penalty of positive and negative back-gate bias voltages (e.g., 1.2V, −1.2V respectively) diminishes the advantage of back-gate bias for power performance and area considerably.

SUMMARY

A first aspect of the present disclosure provides a circuit structure including: a first tap node, a first operational element coupled to the first tap node, the first operational element including at least one transistor having a back-gate, a second tap node coupled to the first operational unit, a second operational element coupled to the second tap node, the second operational element including at least one transistor having a back-gate, a first back-gate biasing voltage regulator coupled to the second operational element and the first tap node, wherein the first back-gate biasing voltage regulator is configured to supply the at least one transistor of the second operational element with a back-gate biasing voltage level that is different than a voltage level available to the second operational element from the second tap node.

A second aspect of the present disclosure provides a circuit structure including: a first tap node, a first operational element coupled to the first tap node, a second tap node coupled to the first operational element, a second operational element coupled to the second tap node, the second operational element including at least one transistor having a back-gate, a third tap node coupled to the second operational element, and a first back-gate biasing voltage regulator coupled to the second operational element and an remote tap node configured to supply the first back-gate biasing voltage regulator with a voltage level that is different than a voltage level available to second operational element from the second tap node and the third tap node.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
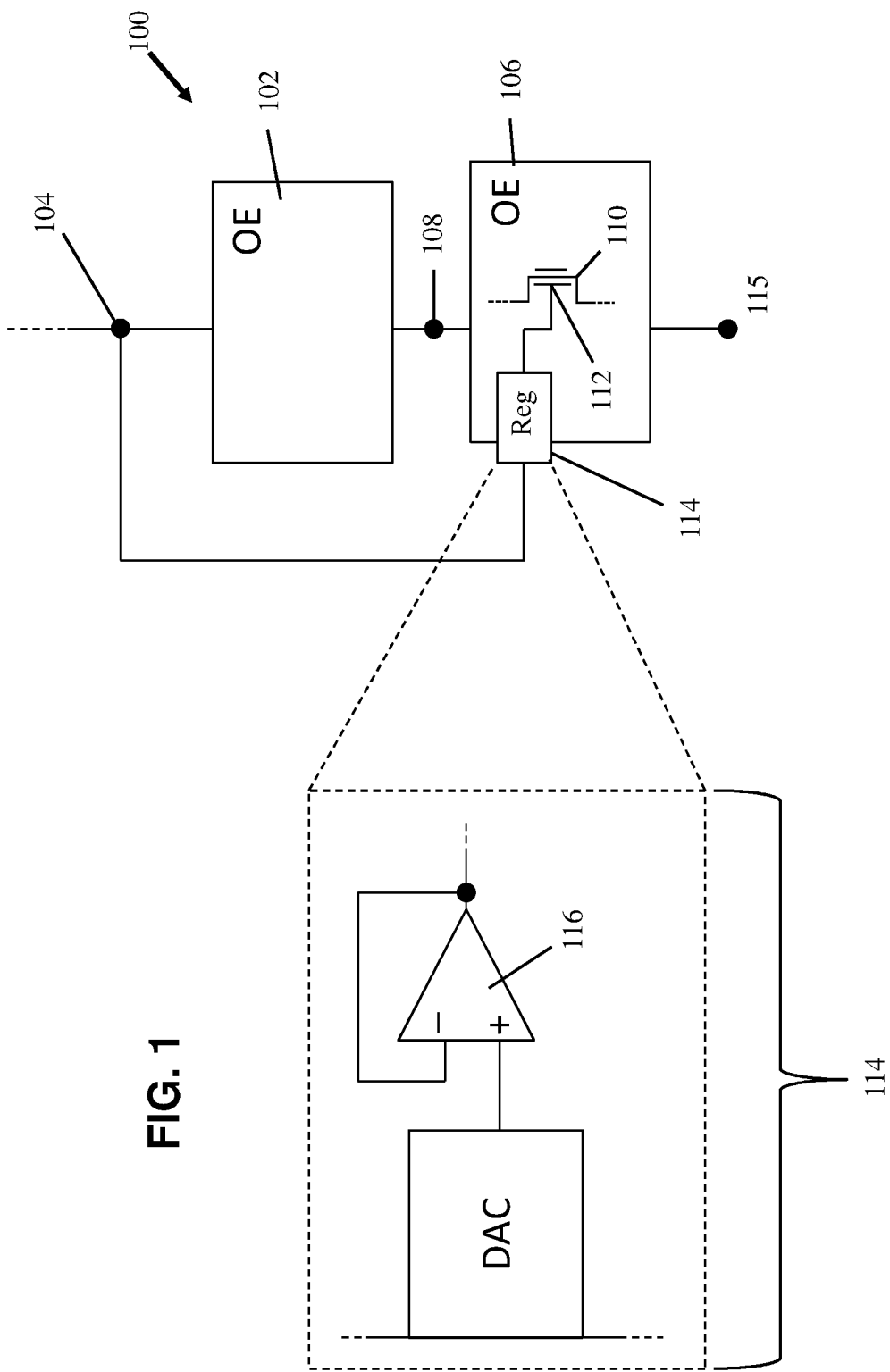
FIG. 1 shows a schematic view of a first embodiment of a portion of a circuit structure topology.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

The following description describes various embodiments of a circuit structure used within a voltage divider topology.

Voltage divider topologies generally have a single voltage supply having a high voltage level, for example 48V, and operational elements that descend from the voltage supply in various interconnecting patterns. These interconnecting patterns of operational elements may include operational elements interconnected in series, parallel, branching, tree configuration, and any other pattern or combination of patterns in which operational elements may be coupled together. Each operational element may further be coupled to a system controller that may control the operational element and ensure that voltage division among the operational elements is working properly. Additionally, the system controller may carry out other functions, not limited to, optimizing operational element working conditions, harvesting operational element results, and targeting specific frequencies within the operational element.

The operating voltage of a single operational element is the difference of the voltage levels applied to the supply and ground voltage pins of the operational unit. The operating voltage for a single operational element results from the supplied voltage in this topology divided over the series of resistances down to ground level. In a purely serial topology, the operating voltage of single operational unit is proportional to the resistance of the operational element divided by the total resistance of the topology. In such topology configurations, the ground voltage supply of one operational element is the supply voltage level of a next interconnected operational element. The resistance of one operational element depends on its current consumption, which depends on the current characteristics of the semiconductor devices on the operational elements and their operational activity. In prior art topologies, only the operational activity can be controlled via the system controller; the device characteristics such as the threshold voltage are determined by the fabrication of the operational unit.

Operational elements may include a group of circuit structures preforming any designed function, where the circuit structure of the operational element uses, at least in part, transistors having back-gate terminals, such as fully-depleted semiconductor-on-insulator (FD-SOI) transistors. FD-SOI transistors have unique device structures, often referred to as ultra-thin body and buried oxide fully-depleted SOI. When biasing voltage is applied to the back-gate terminal of the FD-SOI transistor the voltage is applied to the ultra-thin body which in turn reduces the threshold voltage of the FD-SOI transistor. Threshold voltage is the minimum voltage of inducing electrical conductivity across the drain, source, and gate terminals. This reduction of the threshold voltage effectively reduces the required voltage necessary to operate the FD-SOI transistor. The threshold voltage can be adjusted dynamically from the outside via the voltages applied to the back-gate terminals after the fabrication of the operational element.

Each operational element may perform the same function or different functions as necessitated by circuit design. Operational elements may perform any function, including, but not limited to combinational logic, computing units, and other circuit functions associated with crypto currency and bit-coin mining. While FD-SOI transistors are specifically referred to throughout this application, it is understood that FD-SOI transistors may alternatively be structured as fin transistors, nanosheet transistors, vertical transistors, and/or one or more other currently-known or later developed transistor structures that provide a back-gate terminal to adjust the effective threshold voltage of the transistor. While using FD-SOI transistors, or other transistors having a back-gate terminal, the voltage levels required at the back-gate may be negative or positive and its absolute value may exceed the operational voltage. The generation of these large and negative back-gate voltage levels within an operation element that only receives a small operation voltage requires special circuitry commonly referred to as positive and negative charge pumps. This circuitry consumes area and power within the operating element. As such, the following embodiments provide an area and energy efficient alternative that allows for high voltage back-gate biasing of FD-SOI transistors while also providing other transistor terminals, such as source, drain and gate terminals, with a low operational voltage available to power the operational element that originated through the voltage division topology. When the following circuit structure embodiments are compared with the traditional use of charge pumps and voltage generators, power consumption may be reduced by 3 fold and the required space, usually occupied with charge pump structures, is reduced 4-5 fold.

Turning to FIG. 1, a first embodiment depicting a portion of a topological voltage divider circuit structure 100 is shown. Circuit structure 100 specifically illustrates a first operational element 102 coupled to a first tap node 104. A second operational element 106 is coupled to first operational element 102 via a second tap node 108. First tap node 104 is coupled to another operational element (not shown) and has a voltage level, resulting from voltage division, which enables first operational element 102 to function properly. Due to the designed resistance and circuit design of first operational element 102 there is a voltage division which results in second tap node 108 having a reduced voltage level when compared to first tap node 104. The reduced voltage level at second tap node 108 then acts as the input voltage for second operational element 106. Second operational element 106 further includes a ground level (VSS) tap node 115, at least one transistor 110 having a back-gate terminal 112, such as an FD-SOI transistor, and a first back-gate biasing voltage regulator 114. The functional circuits (not shown) comprising second operational element 106 may include either all the same transistor type or a mixture of transistor types. The mixture of transistor types may include transistors having source, drain, gate, and back-gate terminals as well as other transistor types only having source, drain, and gate terminals.

First back-gate biasing voltage regulator 114 is coupled to first tap node 104 receiving the voltage level of first tap node 104. First back-gate biasing voltage regulator 114 is configured to supply a biasing voltage ranging between the voltage at first tap node 104 and the voltage at ground level tap node 115. As previously described, due to the voltage division that successively occurs after each operational element, the voltage level of first tap node 104 and available to first back-gate biasing voltage regulator 114, is different than the voltage level available to second operational element 106 from second tap node 108 to perform the designed circuit functions.

Upon first back-gate biasing voltage regulator 114 receiving the voltage from first tap node 104, first back-gate biasing voltage regulator 114 ensures the produced positive back gate biasing voltage is the voltage amount necessary to bias transistor(s) 110. While any known voltage regulator structure may be used to bias transistor(s) 110, one embodiment includes a digital-to-analog converter (DAC) augmented with a buffer or unity gain buffer 116. The DAC structure may include any DAC configuration, not limited to a 3-bit DAC, 4-bit DAC, or 5-bit DAC. Using a DAC, the voltage regulator 114 can regulate its output voltage in $2^n$ discrete steps depending on the resolution of the DAC in n bits. Depending on device construction, the positive back gate voltage can be applied to the back gate of a PFET or NFET. For example, for 22FD-SOI flipped well devices the positive back gate voltage may be applied to an NFET. For normal well devices (similarly to traditional bulk devices) the positive back gate voltage may be applied to the back-gate of the PFET.

Coupling the first back-gate biasing voltage regulator 114 to first tap node 104 results in a more positive voltage being supplied to voltage regulator 114 than the voltage level applied to second operational element 106 via second tap node 108. In one embodiment, first back-gate bias voltage regulator 114 may provide a positive biasing voltage range produced from first tap node 104 to bias transistor(s) 110 with a positive voltage level back-gate terminal. Transistor (s) 110 having a positive voltage level back-gate terminal 112 of second operational element 106 may include transistors having only a single channel polarity, depending on device construction, either a p-channel or a n-channel polarity. Alternatively, semiconductor elements 110 may be a combination of p-channel and n-channel transistors types where the at least one transistor 110 is biased through a positive voltage level back-gate terminal with voltage supplied by first back-gate biased voltage regulator 114, and the at least one transistors 110 having the opposite channel polarity may be biased through a negative voltage level back-gate terminal using a negative charge pump. The negative charge pump may be located on or near the first back-gate biased voltage regulator 114. Such an embodiment still reduces the need for both a positive charge pump and would still provide for a decrease in power consumption and space needed.

Figure 2:
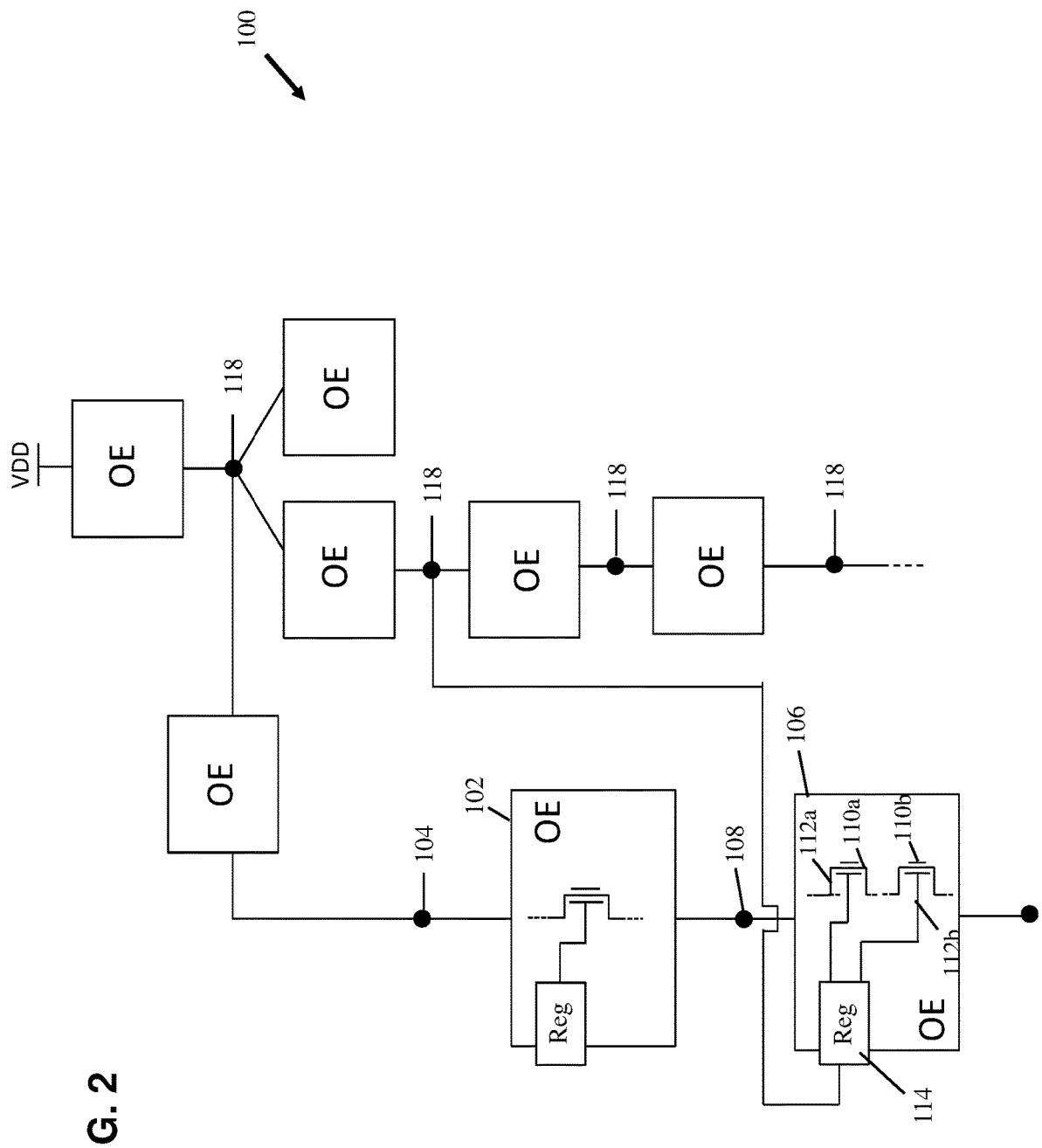
FIG. 2 shows a schematic view of a second embodiment of a portion of a circuit structure topology.

Turning to FIG. 2, a second embodiment depicting a portion of a topological voltage divider circuit structure 100 is shown. The technical advantages and features described herein can be obtained by using embodiments discussed in reference to FIG. 1. Specifically, FIG. 2 provides a general example of how first and second operational elements 102 and 106 may be configured within a larger topological voltage divider circuit structure having other operational elements OE. First back-gate biasing voltage regulator 114 may also be configured to receive a voltage level by coupling to a remote tap node 118. Remote tap node 118 may be any other tap node existing between at least two operational elements within the voltage divider topology having a different voltage level than the voltage level available to second operational element 106 via second tap node 108. As previously discussed, a voltage division occurs after each successive operational element. This voltage division is generally designed to have a specific voltage drop after each operational element. Knowing the voltage division or voltage drop associated with each operational element allows for first back-gate biasing voltage regulator 114 to be coupled to remote node 118, where remote node 118 has a sufficiently positive or negative voltage level to properly bias at least one transistor 110 with a corresponding positive or negative voltage level back-gate terminal.

As depicted in FIG. 2, first back-gate biasing voltage regulator 114 may receive a positive voltage level from coupling with first tap node 104 and a negative voltage from coupling to remote tap node 118 (i.e., positive/negative relative to voltage level at tap node 115). A negative voltage level in this case means that the voltage level is less than the ground (VSS) voltage level at tap node 115 of operational element 106. That is, the voltage level at remote tap node 118 is lower than the ground (VSS) voltage level at tap node 115 of operational element 106.

When first back-gate biasing voltage regulator 114 receives both a negative and positive voltage supply, first back-gate biasing voltage regulator 114 may regulate and provide both positive and negative biasing voltages to the at least one transistors 110a, 110b, where the at least one transistor 110a is a p-channel device and has a positive biasing voltage applied to its back gate 112a, and the at least one transistor 110b is a n-channel device and has a negative biasing voltage applied to its back gate 112b. As a result of this configuration, the second operational element has access to both high positive and negative voltage levels that can be used to bias FD-SOI transistors having both n-channel and p-channel configurations, and allowing the operational element circuit to function as designed.

Figure 3:
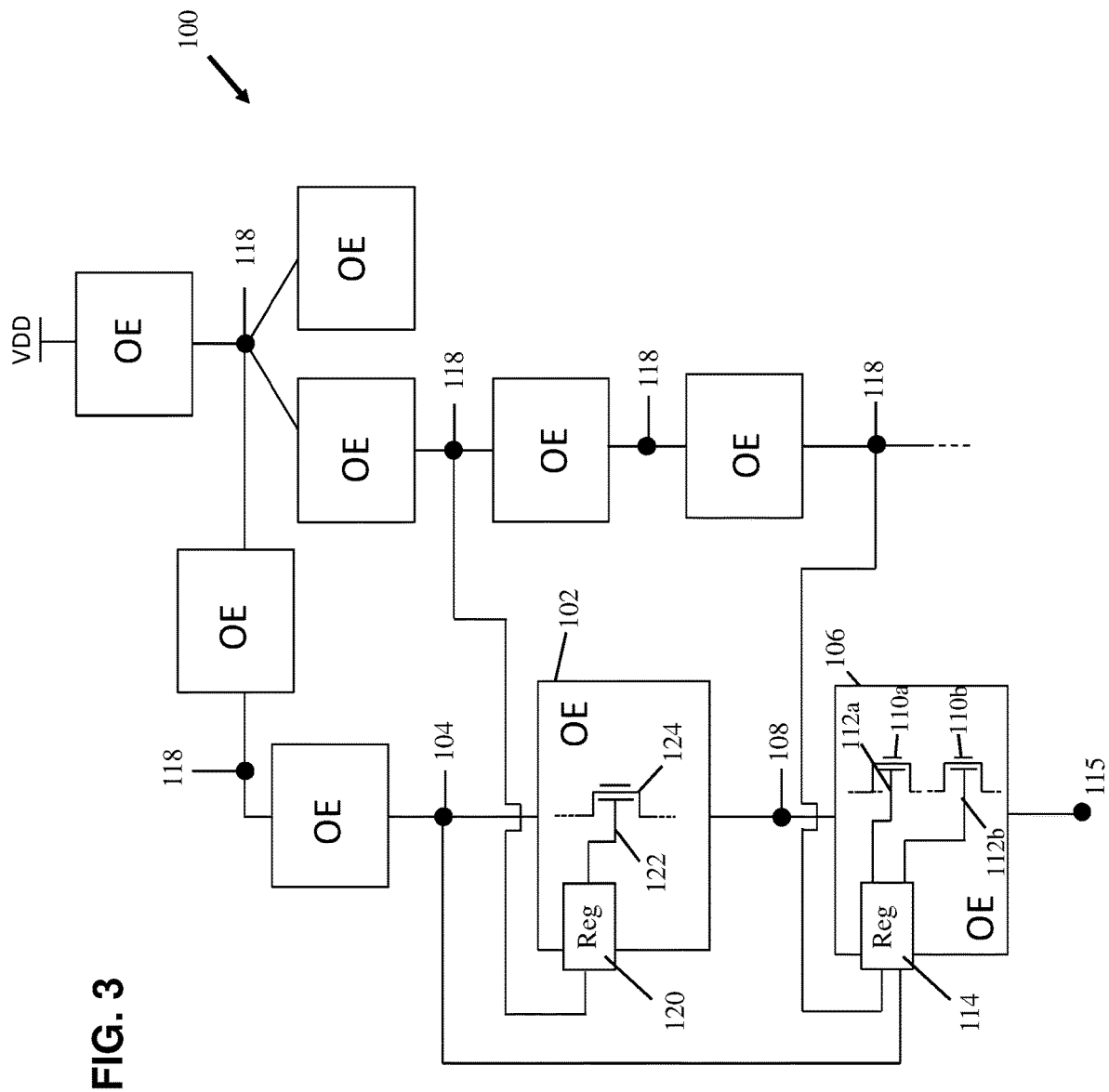
FIG. 3 shows a schematic view of a third embodiment of a portion of a circuit structure topology.

Turning to FIG. 3, a third embodiment depicting a portion of a topological voltage divider circuit structure 100 is shown. As shown in FIG. 3 first operational element 102 further comprises a second back-gate biasing voltage regulator 120. Second back-gate biasing voltage regulator 120 may include any previously discussed voltage regulator. Second back-gate biasing voltage regulator 120 may be the same voltage regulator structure comprising first back-gate biasing voltage regulator 114, or second back-gate biasing voltage regulator 120 may comprise of a different voltage regulator structure. Second back-gate biasing voltage regulator 120 may be configured to receive a voltage level from remote tap node 118 that is different than the voltage level available to first operational element 102 from first tap node 104. The voltage level of remote node 118, when compared to the voltage level of first tap node 104, can have either a higher positive voltage level or a more negative voltage level. Second back-gate biasing voltage regulator 120 may then be coupled to back gate terminal 122 of transistor(s) 124 to provide the appropriate biasing voltage.

Figure 4:
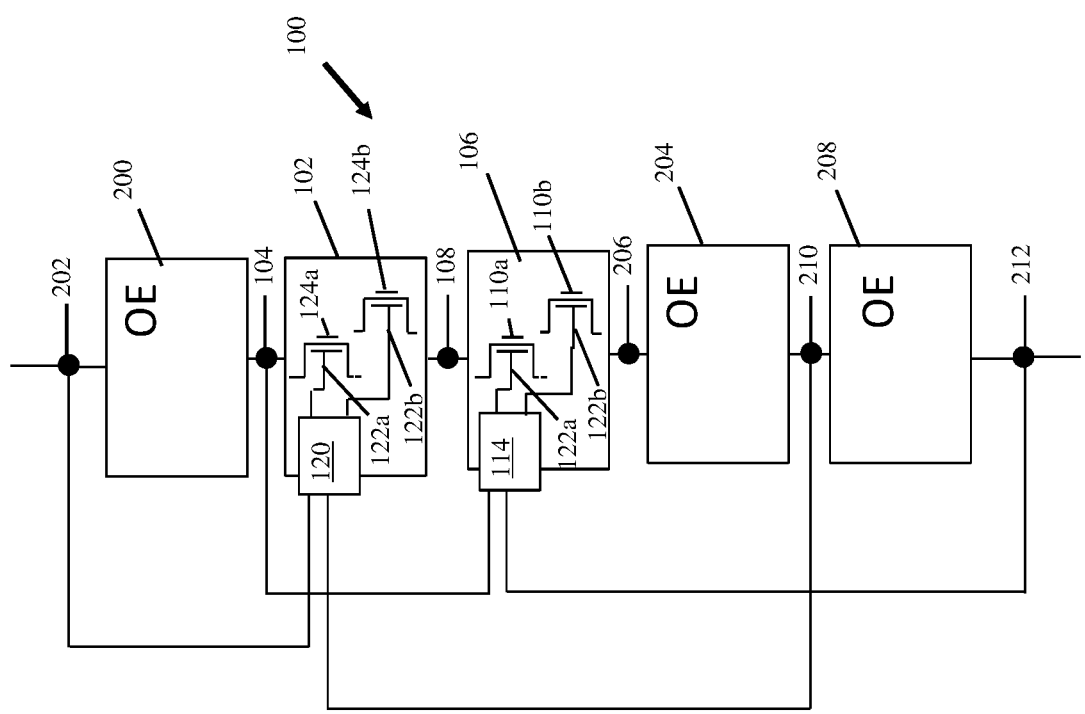
FIG. 4 shows a schematic view of a fourth embodiment a circuit structure topology.

Turning to FIG. 4, a fourth embodiment depicting a portion of a topological voltage divider circuit structure 100 is shown. Specifically, FIG. 4 demonstrates how multiple operational elements may tap different voltages at various nodes within the topological circuit to obtain the required biasing voltage level. In addition to structures and functions pertaining to FIGS. 1-3, FIG. 4 shows a possible embodiment having five serially connected operational elements. Operational element 200 is coupled to other tap node 202 and first tap node 104. First and second operational elements 102 and 106 are coupled via second tap node 108. Second operational element 106 may be coupled to a third operational element 204 via a third tap node 206. A fourth operational element 208 may be coupled to the third operational element via a fourth tap node 210. Fourth operational element 208 may also have a fifth tap node 212. Each of the initial, third, and fourth operational elements may have at least one transistor having a back-gate terminal or may include different transistor types. Due to the successive voltage division occurring within the voltage divider topology, the third tap node 206 may have a greater voltage level than the voltage level available at fourth tap node 206. In addition to coupling with first tap node 104, first back-gate biasing voltage regulator 114 of second operational element 106 may be further coupled to fifth tap node 212. As a result of the voltage drop among operational elements, first tap node 104 may be sufficiently positive to allow for first back-gate biasing voltage regulator 114 to bias back-gate terminals 112a of p-channel transistor(s) 110a. Similarly, fifth tap node 212 may be sufficiently negative to allow for first back-gate biasing voltage regulator 114 to bias back-gate terminals 112b of n-channel transistor(s) 110b.

Additionally, second back-gate biasing voltage regulator 120 of first operational element 102 may be coupled to other tap node 202 having a higher voltage level than the voltage level available to first operational element via first tap node 104. Second back-gate biasing voltage regulator 120 may further be coupled to either third tap node 206 or fourth tap node 208. Both third tap node 206 and fourth tap node 208 will have a lower voltage level than the voltage level available to first operational element via second node 108. Second back-gate biasing voltage regulator will be coupled to the tap node having the voltage necessary to bias the back-gate terminals 122 of the at least one transistor 124. The aforementioned configuration could be used throughout the topological circuit structure to properly bias the back gate terminals of each operational unit.

It should be noted that in 12FD-SOI with DUAL STI devices it is possible to apply large positive and negative large voltage levels to the same back-gate bias terminal—for instance for the p-channel. For example, in one case, the whole range of negative to positive voltage may be applied to one back-gate terminal. In another case, a restricted voltage range, small negative and large positive, may be applied to one terminal. Alternatively, a positive voltage may be applied to one terminal and a negative voltage to another terminal. Normally, two voltage regulators may be used per operational element, one responsible to regulate the voltage at the p-channel back-gate terminal and one to regulate the voltage at the n-channel back-gate terminal. When using only one voltage regulator for one terminal type, the other terminal may be set to a default level.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
   a first tap node;
   a first operational element coupled to the first tap node, the first operational element including at least one transistor having a back-gate terminal;
   a second tap node coupled to the first operational unit;
   a second operational element coupled to the second tap node, the second operational element including at least one transistor having a back-gate terminal;
   a first back-gate biasing voltage regulator coupled to the second operational element and the first tap node, wherein the first back-gate biasing voltage regulator is configured to supply the at least one transistor of the second operational element with a back-gate biasing voltage level that is different than a voltage level available to the second operational element from the second tap node,
   a third tap node coupled to the second operational element;
   a third operational element coupled to the third tap node, the third operational element having at least one back-gated transistor; and
   a fourth tap node coupled to the third operational element, wherein the third tap node has a greater voltage level than the voltage level available at the fourth tap node.

2. The structure of claim 1, wherein the first back-gate biasing voltage regulator coupled to the second operational element further comprises a digital-to-analog converter (DAC) and a buffer.

3. The structure of claim 1, wherein the first back-gate biasing voltage regulator is further configured to supply a positive back-gate biasing voltage level and a negative back-gate biasing voltage level to bias the at least one transistor of the second operational element.

4. The structure of claim 1, wherein the first back-gate biasing voltage regulator is further configured to receive a voltage level available from a remote tap node that is different than the voltage level available to the second operational element from the second tap node.

5. The structure of claim 1, wherein the first operational element further comprises a second back-gate biasing voltage regulator.

6. The structure of claim 5, wherein the second back-gate biasing voltage regulator is configured to receive a voltage level from a remote tap node that is different than the voltage level available to the first operational element from the first tap node.

7. The structure of claim 5, wherein the third tap node is coupled to the second back-gate biasing voltage regulator to supply a negative voltage level to the second back-gate biasing voltage regulator that is less than the voltage level available at the second tap node.

8. The structure of claim 5, wherein the first back-gate biasing voltage regulator is further configured to supply the at least one transistor of the second operational element with a lower voltage level than a voltage level available to the second operational element from the third tap node.

9. The structure of claim 5, wherein the first back-gate biasing voltage regulator is coupled to the fourth tap node and configured to supply the at least one transistor of the second operational element with a lower voltage level than a voltage level at the second tap node.

10. The structure of claim 1, wherein each of the at least one transistor of the first and second operational elements includes a fully-depleted semiconductor-on-insulator (FD-SOI) transistor.

11. A circuit structure comprising:
a first tap node;
a first operational element coupled to the first tap node;
a second tap node coupled to the first operational element, wherein there is a voltage division between the first tap node and second tap node;
a second operational element coupled to the second tap node, the second operational element including at least one transistor having a back-gate terminal;
a third tap node coupled to the second operational element;
a first back-gate biasing voltage regulator coupled to the second operational element and a remote tap node configured to supply the first back-gate biasing voltage regulator with a voltage level that is different than a voltage level available to the second operational element from the second tap node and the third tap node,
a third operational element coupled to the third tap node, the third operational element having at least one back-gated transistor; and
a fourth tap node coupled to the third operational element, wherein the third tap node has a greater voltage level than the voltage level available at the fourth tap node.

12. The structure of claim 11, wherein the first back gate biasing voltage regulator is further configured to supply a positive back-gate biasing voltage level and a negative back-gate biasing voltage level to bias the at least one transistor of the second operational element.

13. The structure of claim 11, wherein the voltage level of the remote tap node is greater than the voltage level available to the second operational element from the second and third tap node.

14. The structure of claim 11, wherein the voltage level of the remote tap node is lower than the voltage level available to the second operational element from the second and third tap node.

15. The structure of claim 11, wherein the circuit structure further comprises:
a fourth operational element coupled to the fourth tap node; and
a fifth tap node coupled to the fourth operational element and coupled to the first back-gate biasing voltage regulator, wherein the fourth tap node has a greater voltage level than the voltage level available at the fifth tap node.

16. The structure of claim 11, wherein the first back-gate biasing voltage regulator is coupled to the first tap node and configured to supply the at least one transistor of the second operational element with a back-gate biasing voltage level that is different than a voltage level available to the second operational element from the second or third tap node.

17. The structure of claim 11, wherein each of the at least one transistor of the first and second operational elements includes a fully-depleted semiconductor-on-insulator (FD-SOI) transistor.

18. The structure of claim 11, wherein the first back-gate biasing voltage regulator of the second operational element further comprises a digital-to-analog converter (DAC) and a buffer.

* * * * *